(12) United States Patent
Eimitsu et al.

(10) Patent No.: US 8,039,874 B2
(45) Date of Patent: Oct. 18, 2011

(54) SEMICONDUCTOR INTEGRATED CIRCUIT

(75) Inventors: Masatomo Eimitsu, Kanagawa (JP); Takanori Saeki, Kanagawa (JP)

(73) Assignee: Renesas Electronics Corporation, Kanagawa (JP)

( * ) Notice: Subject to any disclaimer, the term of this patent is extended or adjusted under 35 U.S.C. 154(b) by 94 days.

(21) Appl. No.: 11/902,391

(22) Filed: Sep. 21, 2007

(65) Prior Publication Data

US 2008/0105929 A1 May 8, 2008

(30) Foreign Application Priority Data

Nov. 7, 2006 (JP) ................................ 2006-301302

(51) Int. Cl.
*H01L 27/118* (2006.01)

(52) U.S. Cl. ........ 257/206; 257/202; 257/204; 257/207; 257/390; 257/401; 257/909; 257/919; 257/E27.108

(58) Field of Classification Search .................. 257/202, 257/390, 204, 206–208, 401, 909, 919, E27.108
See application file for complete search history.

(56) References Cited

U.S. PATENT DOCUMENTS

| 4,570,176 | A | * | 2/1986 | Kolwicz | 257/373 |
| 5,777,941 | A | * | 7/1998 | Pascucci | 365/230.02 |
| 2005/0205894 | A1 | * | 9/2005 | Sumikawa et al. | 257/202 |

FOREIGN PATENT DOCUMENTS

| JP | 9-289251 | 11/1997 |
| JP | 2005-229061 A | 8/2005 |

OTHER PUBLICATIONS

English Translation of JP09289251A (P1996-100926).*
English Language Translation of JP2005-229061A (P2004-038795).*
V. Chan et al., "Strain for CMOS Performance Improvement," IEEE 2005 Custom Integrated Circuits Conference, pp. 667-674.

* cited by examiner

*Primary Examiner* — Jerome Jackson, Jr.
*Assistant Examiner* — Yu Chen
(74) *Attorney, Agent, or Firm* — Foley & Lardner LLP

(57) ABSTRACT

According to an aspect of the present invention, there is provided a semiconductor IC that includes a plurality of standard cells arranged in a first direction on a semiconductor substrate, and a first diffusion layer connected to a first power source and a second diffusion layer connected to a second power source in the each standard cell, wherein the first diffusion layers as well as the second diffusion layers of neighboring standard cells are integrally formed.

8 Claims, 15 Drawing Sheets

SEMICONDUCTOR INTEGRATED CIRCUIT

BACKGROUND OF THE INVENTION

1. Field of the Invention

The present invention relates to a semiconductor integrated circuit (IC) and, specifically, to a semiconductor IC having a plurality of standard cells.

2. Description of Related Art

As a layout design technology for forming an IC on a semiconductor substrate in a short time, a standard cell methodology is widely used. Specifically, small scale circuits such as an inverter circuit, a NAND circuit and the like are registered as standard cells in a cell library, and the semiconductor IC is designed by arranging standard cells in a row.

By the way, both gate pitch and gate length of MOSFETs (metal oxide semiconductor field effect transistor) have been decreasing with miniaturization of semiconductor ICs in recent years. Therefore, the variation of MOSFET performance is caused by the variation in the gate length since it is difficult to control gate length in the photolithography process. To solve this problem, a semiconductor IC is disclosed in Japanese Unexamined Patent Publication No. 9-289251 which has gate electrodes with the same gate length formed at the same pitch by inserting a dummy MOSFET between two standard cells. Thus, the variation in the gate length in photolithography process is reduced.

Further, to reduce the number of standard cells registered in a cell library, standard cell arrays having different drive capability are produced by overlapping diffusion layers of a plurality of registered standard cells in Japanese Unexamined Patent Publication No. 2005-229061.

However, the invention in Japanese Unexamined Patent Publication No. 9-289251 reverses the miniaturization of semiconductor ICs since it requires inserting dummy MOSFETs between each standard cell.

Victor Chan et al. reported that the variation in MOSFET ON current to LOD (Length of Diffusion) becomes pronounced as the miniaturization of semiconductor ICs advances in their paper "Strain for CMOS performance Improvement" at IEEE 2005 Custom Integrated Circuits Conference. Specifically, the smaller the LOD is, the wider the variation in ON current is. To the contrary, if LOD is larger than certain value, ON current becomes constant. Therefore, even if a MOSFET has the same designed ON current, ON current can be different according to the size of LOD in practice. This problem cannot be solved in Japanese Unexamined Patent Publications No. 9-289251 and No. 2005-229061.

SUMMARY

According to an aspect of the present invention, there is provided a semiconductor IC that includes a plurality of standard cells arranged in a first direction on a semiconductor substrate, and a first diffusion layer connected to a first power source and a second diffusion layer connected to a second power source in the each standard cell, wherein the first diffusion layers as well as the second diffusion layers of neighboring standard cells are integrally formed.

The present invention provides a semiconductor IC which includes a MOSFET having a desired ON current with sufficient LOD.

BRIEF DESCRIPTION OF THE DRAWINGS

The above and other objects, advantages and features of the present invention will be more apparent from the following description of certain preferred embodiments taken in conjunction with the accompanying drawings, in which.

DETAILED DESCRIPTION OF THE PREFERRED EMBODIMENTS

The invention will be now described herein with reference to illustrative embodiments. Those skilled in the art will recognize that many alternative embodiments can be accomplished using the teachings of the present invention and that the invention is not limited to the embodiments illustrated for explanatory purposes.

First Embodiment

Figure 1:
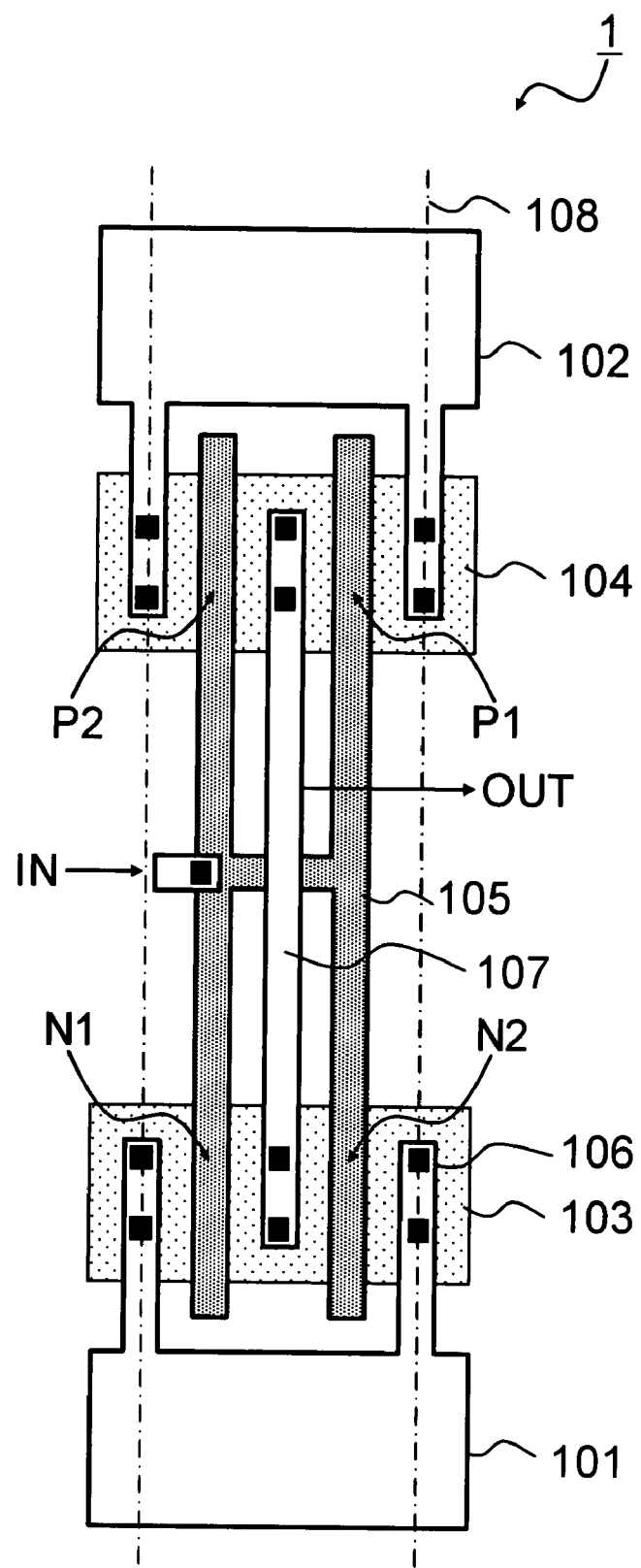
FIG. 1 is a plan view showing a standard cell for a semiconductor IC of the first embodiment of the present invention.
Figure 2:
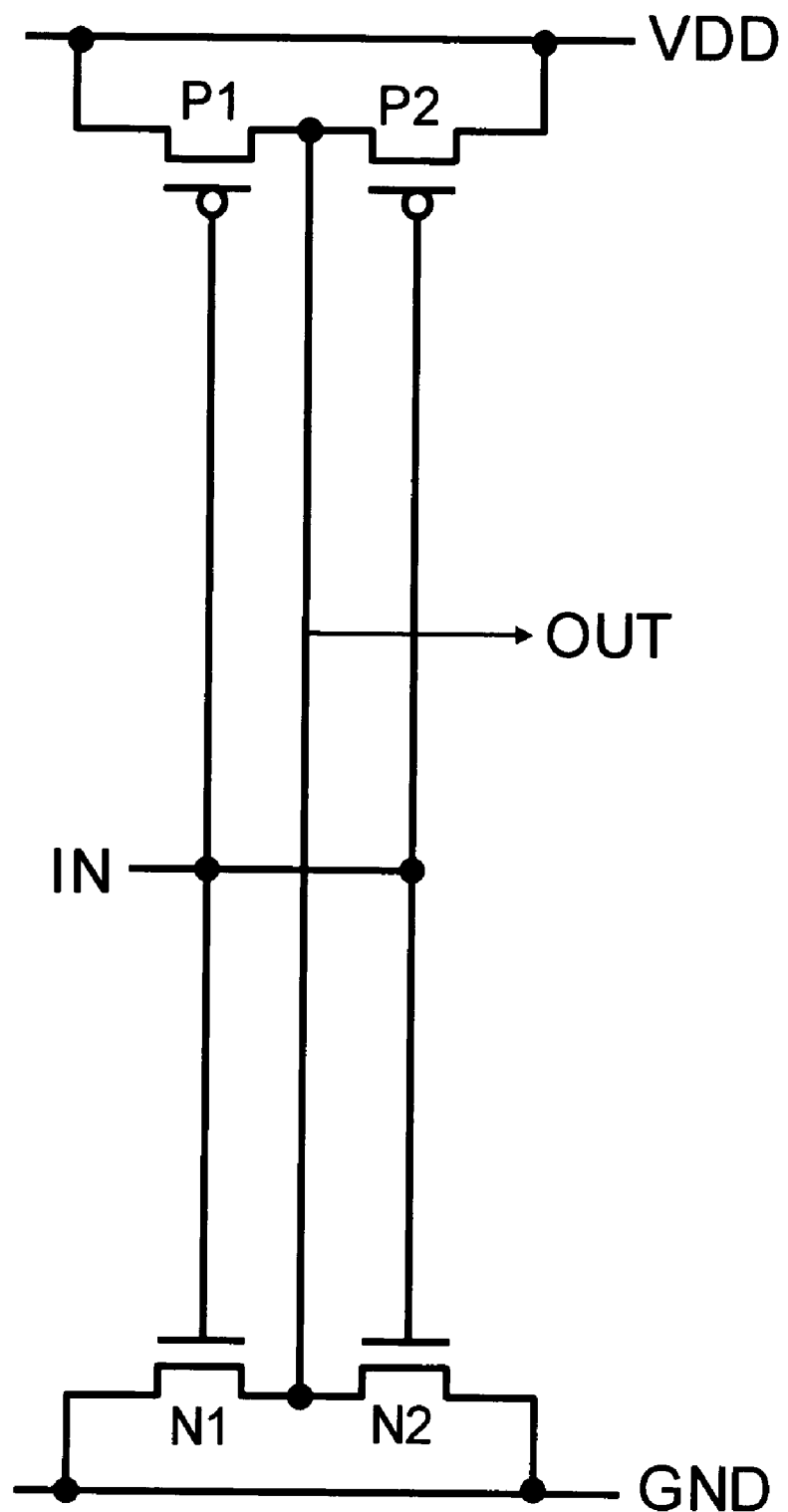
FIG. 2 is a circuit diagram corresponding to the standard cell of FIG. 1.

FIG. 1 is a plan view showing a standard cell for a semiconductor IC of the first embodiment of the present invention. FIG. 2 is a circuit diagram corresponding to the standard cell of FIG. 1.

A standard cell 1 of FIG. 1 includes a grounding wire 101, a power source wire 102, an N-type diffusion layer 103, a P-type diffusion layer 104, a polysilicon layer 105, a contact 106, and a metal wire 107. Also, as shown in FIG. 1, the standard cell 1 includes two P-channel MOSFETs (P1 and P2) and two N-channel MOSFETs (N1 and N2). This standard cell 1 constitutes an inverter circuit.

The grounding wire 101 is a metal wire from the ground and the power source wire 102 is a metal wire from the power source. As shown in FIG. 1, the grounding wire 101 is arranged at the bottom of FIG. 1. On the other hand, the power source wire 102 is arranged at the top of FIG. 1. As a matter of course, the positional relationship may be opposite. Also, the grounding wire 101 and the power source wire 102 are formed at least from one cell boundary 108 to the other cell boundary 108. Specifically, the grounding wire 101 and the power source wire 102 are integrally formed respectively by combining a plurality of standard cells. Now, although the grounding wire 101 is connected to the ground in this embodiment, the grounding wire 101 may be connected to one power source having lower potential than the other power source.

The N-type diffusion layer 103 is composed of silicon (Si) containing phosphorus (P), arsenic (As) or the like, for example. The source and drain regions of the N-channel MOSFET are formed in the N-type diffusion layer 103. As shown in FIG. 1, the N-type diffusion layer 103 is formed near the grounding wire 101 and at least formed from one cell boundary 108 to the other cell boundary 108 without isolation. In FIG. 1, three N-type diffusion layers 103 are formed. The N-type diffusion layers 103 of neighboring standard cells are integrally formed by combining a plurality of standard cells. As a matter of course, a P-type well is required below the N-type diffusion layer 103 when using an N-type substrate.

Among three N-type diffusion layers 103, two lines of the polysilicon layers 105 are formed from the bottom side to the top side of FIG. 1. Each gate electrode of two N-channel MOSFETs N1 and N2 is composed of the polysilicon layer 105. As mentioned above, no isolation region is formed between each N-type diffusion layer 103 of each standard cell, and the N-type diffusion layers 103 of neighboring standard cells are integrally formed by combining a plurality of standard cells. Thus, sufficient LOD is acquired and N-channel MOSFETs with desired ON current are obtained. To reduce the variation in ON current, the constant width of the N-type diffusion layer 103 (from the bottom side to the top side of FIG. 1) is preferred as shown in FIG. 1. Here, the constant width means that the width of the N-type diffusion layer 103 is constant in order that the variation in ON current does not matter. Thus, some fluctuation of the width of the N-type diffusion layer 103 is allowed.

Over the N-type diffusion layers 103, two contacts 106 arranged in the top-to-bottom direction are formed at even intervals in a left-to-right direction, or in the direction in which a plurality of standard cells are arranged. Specifically, three lines, each of which has the two contacts 106, are formed. The two lines on both sides of the three lines are formed at each cell boundary 108. The center one of the three lines is formed in the center between the two lines of the polysilicon layers 105 over the N-type diffusion layers 103. Thus, the variation in ON current can further be reduced.

The two N-type diffusion layers 103 are connected to the grounding wire 101 through the contacts 106 at each cell boundary 108. Specifically, the standard cell 1 has connecting portions for connecting the N-type diffusion layer 103 to the grounding wire 101 at each cell boundary 108. The standard cell 1 shares the two connecting portions with neighboring standard cells of the both sides.

The P-type diffusion layer 104 is composed of silicon (Si) containing boron (B), for example. The source and drain regions of the P-channel MOSFET are formed in the P-type diffusion layer 104. As shown in FIG. 1, the P-type diffusion layer 104 is formed near the power source wire 102 and at least formed from one cell boundary 108 to the other cell boundary 108 without isolation. In FIG. 1, three P-type diffusion layers 104 are formed. The P-type diffusion layers 104 of neighboring standard cells are integrally formed by combining a plurality of standard cells. As a matter of course, an N-type well is required below the P-type diffusion layer 104 when using a P-type substrate.

Among three P-type diffusion layers 104, two lines of the polysilicon layers 105 are formed from the bottom side to the top side of FIG. 1. Each gate electrode of two P-channel MOSFETs P1 and P2 is composed of the polysilicon layer 105. As mentioned above, no isolation region is formed between each P-type diffusion layer 104 of each standard cell and the P-type diffusion layers 104 of neighboring standard cells are integrally formed by combining a plurality of standard cells. Thus, sufficient LOD is acquired and P-channel MOSFETs with desired ON current are obtained. To reduce the variation in ON current, the constant width of the P-type diffusion layer 104 (from the bottom side to the top side of FIG. 1) is preferred as shown in FIG. 1. Here, the constant width means that the width of the P-type diffusion layer 104 is constant in order that the variation in ON current does not matter. Thus, some fluctuation of the width of the P-type diffusion layer 104 is allowed.

Over the P-type diffusion layers 104 as well as the N-type diffusion layers 103, two contacts 106 arranged in the top-to-bottom direction are formed at even intervals in the left-to-right direction, or in the direction in which a plurality of standard cells are arranged. Thus, the variation in ON current can further be reduced.

The two P-type diffusion layers 104 are connected to the power source wire 102 through the contacts 106 at each cell boundary 108. Specifically, the standard cell 1 has connecting portions for connecting the P-type diffusion layer 104 to the power source wire 102 at each cell boundary 108. The standard cell 1 shares the two connecting portions with neighboring standard cells of the both sides.

The polysilicon layer 105 is composed of polysilicon. The polysilicon layer 105 constitutes the gate electrode of the MOSFET between the two N-type diffusion layers 103 or the two P-type diffusion layers 104. As shown in FIG. 1, among the three N-type diffusion layers 103 and the three P-type diffusion layers 104, two lines of the polysilicon layers 105 are formed in the up-to-down direction of FIG. 1. When combining a plurality of standard cells, the polysilicon layers 105 are formed at even intervals. It is preferred that the gate length of each gate electrode composed of the polysilicon layer 105 is the same with each other. The variation of the gate length in the photolithography process can be reduced by forming gate electrodes with the same gate length at the same pitch as mentioned above. Here, the two lines of the polysilicon layers 105 are connected to each other in the center region of the standard cell 1 to thereby form H-shape.

The metal wire 107 is formed based on desired circuit structure to connect one component to another. The metal wire 107 is connected to each component through the contacts 106.

Next, the circuit structure of the standard cell 1 of FIG. 1 is explained by using the circuit diagram of FIG. 2. The standard cell 1 has two P-channel MOSFETs (P1 and P2) and two N-channel MOSFETs (N1 and N2).

An input terminal represented as "IN" in FIG. 2 is connected to the gate electrodes of the above four MOSFETs (P1, P2, N1 and N2). Each P-channel MOSFET (P1 and P2) is connected to the power source represented as "VDD" in FIG. 2. Further, each drain region of P1 and P2 is connected to each other in parallel. On the other hand, Each N-channel MOSFET (N1 and N2) is connected to the ground represented as "GND" in FIG. 2. Further, each drain region of N1 and N2 is connected to each other in parallel. The both drain regions of the P-channel MOSFETs (P1 and P2) and the N-channel MOSFETs (N1 and N2) are connected to an output terminal represented as "OUT" in FIG. 2.

Specifically, the standard cell 1 has one inverter circuit composed of the P-channel MOSFET P1 and the N-channel MOSFET N1 connected in series with each other. Also, the standard cell 1 has the other inverter circuit composed of the P-channel MOSFET P2 and the N-channel MOSFET N2 connected in series with each other. Thus, the standard cell 1 constitutes an inverter circuit composed of the above two inverter circuits which are connected to each other in parallel.

Figure 3:
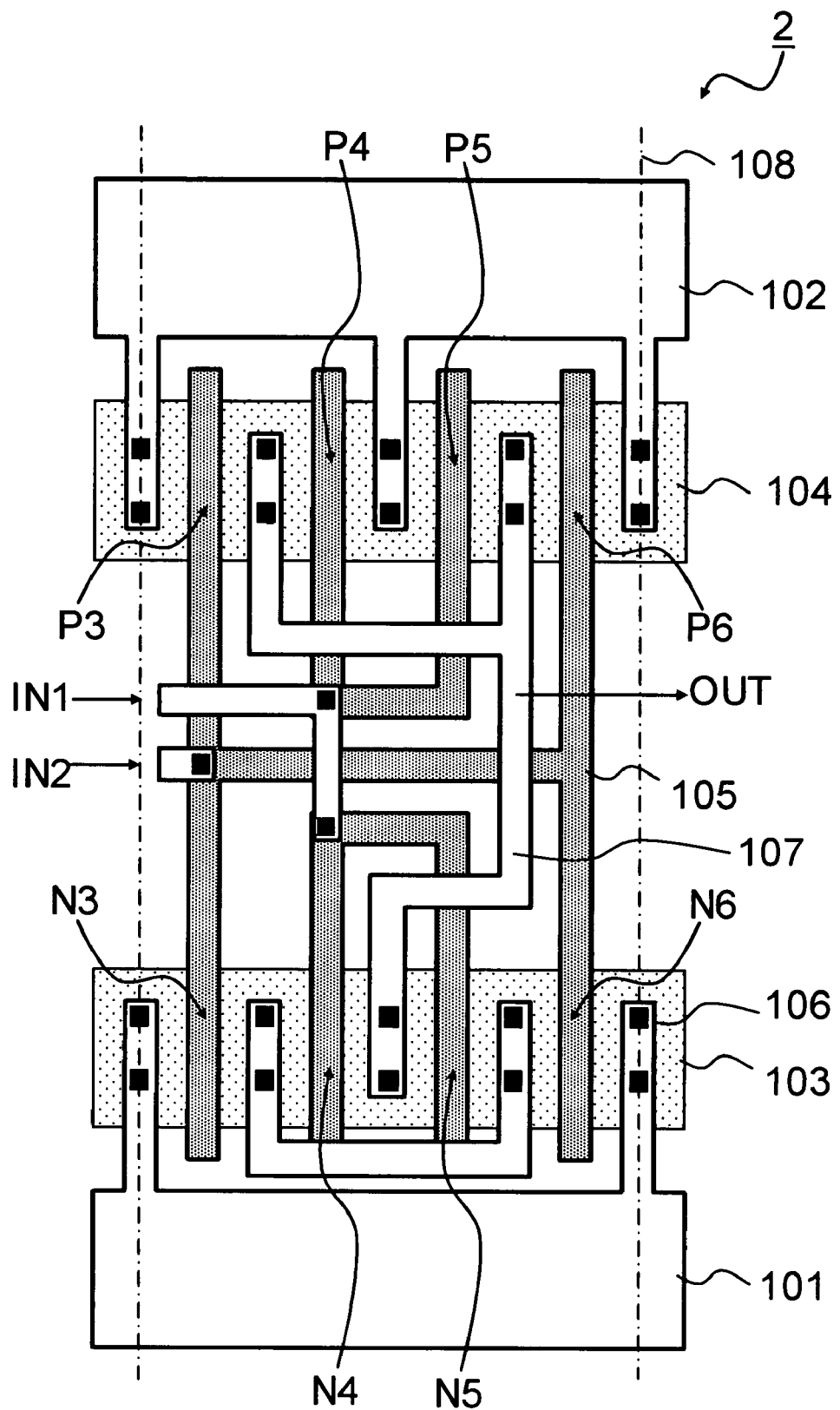
FIG. 3 is a plan view showing another standard cell for the semiconductor IC of the first embodiment of the present invention.
Figure 4:
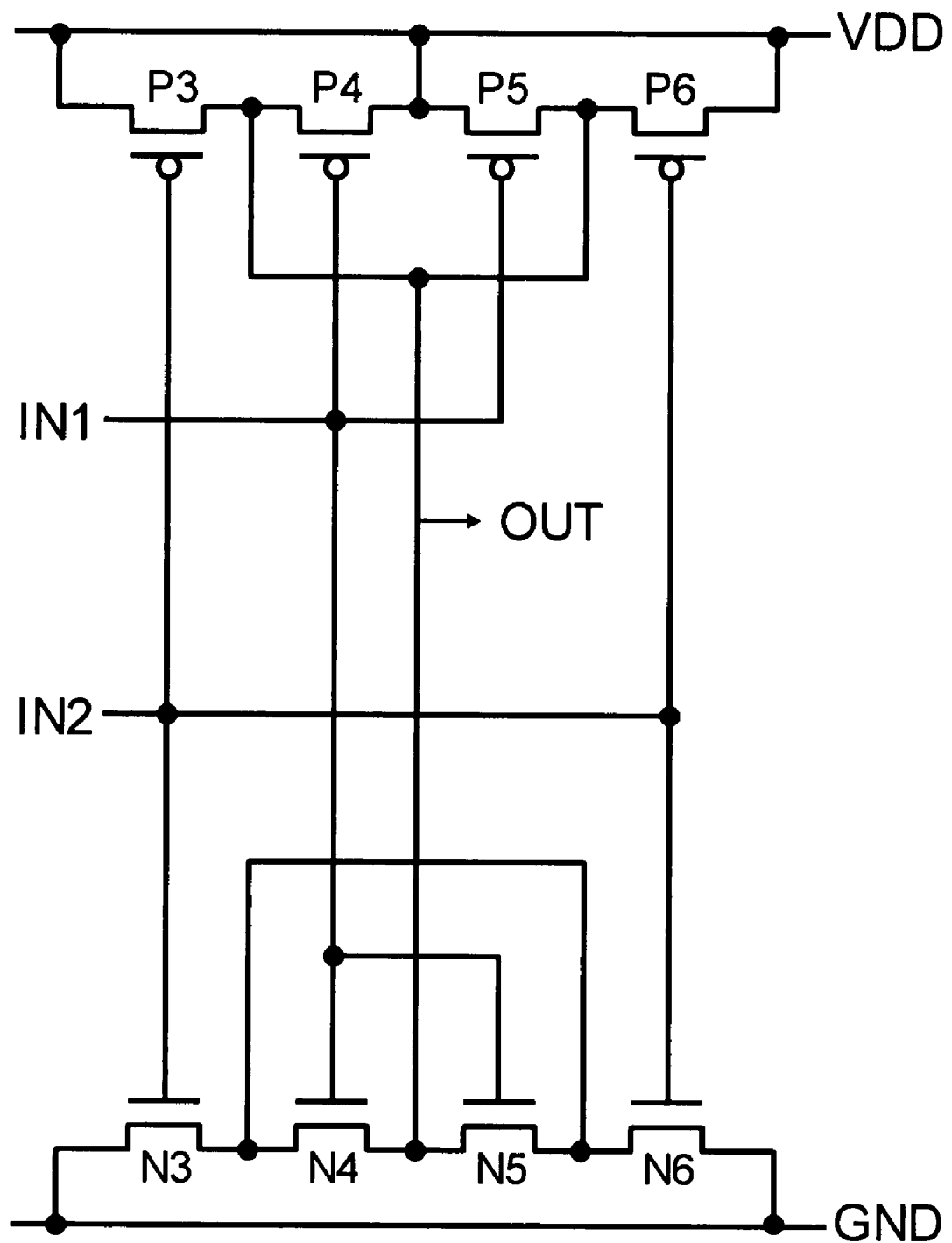
FIG. 4 is a circuit diagram corresponding to the standard cell of FIG. 3.

FIG. 3 is a plan view showing another standard cell 2 for the semiconductor IC of the first embodiment of the present invention. In FIG. 3, components identical to those in FIG. 1 are denoted by reference numerals identical therein with detailed description omitted as appropriate. FIG. 4 is a circuit diagram corresponding to the standard cell of FIG. 3.

The main difference between the standard cell 1 of FIG. 1 and the standard cell 2 of FIG. 3 is that four lines of the polysilicon layers 105 are formed among five N-type diffusion layers 103 and five P-type diffusion layers 104 in the standard cell 2. Therefore, the standard cell 2 has four P-channel MOSFETs (P3 to P6) and four N-channel MOSFETs (N3 to N6). This standard cell 2 constitutes a NAND circuit. Here, as shown in FIG. 3, the two lines of the polysilicon layers 105 on both sides of the above four lines are connected to each other in the center region of the standard cell 2 to thereby form H-shape. On the other hand, the two lines of the polysilicon layers 105 in the center of the above four lines are separated into the side of the N-type diffusion layer 103 and the side of the P-type diffusion layer 104. Further, in the both sides of the N-type diffusion layer 103 and the P-type diffusion layer 104, the two neighboring lines of the polysilicon layers 105 in the center of the above four lines are connected to each other in the center region of the standard cell 2 to thereby form U-shape respectively.

Next, the circuit structure of the standard cell 2 of FIG. 3 is explained by using the circuit diagram of FIG. 4. One input terminal represented as "IN1" in FIG. 4 is connected to the gate electrodes of the four MOSFETs (P4, P5, N4 and N5). On the other hand, the other input terminal represented as "IN2" in FIG. 4 is connected to the gate electrodes of the four MOSFETs (P3, P6, N3 and N6).

Each P-channel MOSFET (P3 to P6) is connected to the power source represented as "VDD" in FIG. 4. Further, each drain region of P4 and P5 which are both connected to IN1 is connected to each other in parallel and to an output terminal represented as "OUT" in FIG. 4. Also, each drain region of P3 and P6 which are both connected to IN2 is connected to each other in parallel and to the output terminal.

On the other hand, only N-channel MOSFETs (N3 and N6) are connected to the ground represented as "GND" in FIG. 4. Further, each drain region of N3 and N6 is connected to each other in parallel. Also, each drain region of N4 and N5 is connected to each other in parallel. Further, N3 and N6 are connected to N4 and N5 in series. The drain region of N4 and N5 is connected to the output terminal.

As mentioned above, in the standard cell 2, the P-channel MOSFETs (P4 and P5) which are connected in parallel to each other through IN1 are connected in parallel to the P-channel MOSFETs (P3 and P6) which are connected in parallel to each other through IN2. In addition, the N-channel MOSFETs (N4 and N5) which are connected in parallel to each other through IN1 are connected in series to the N-channel MOSFETs (N3 and N6) which are connected in parallel to each other through IN2. Therefore, the standard cell 2 constitutes an NAND circuit composed of two NAND circuits which are connected to each other in parallel.

Figure 5:
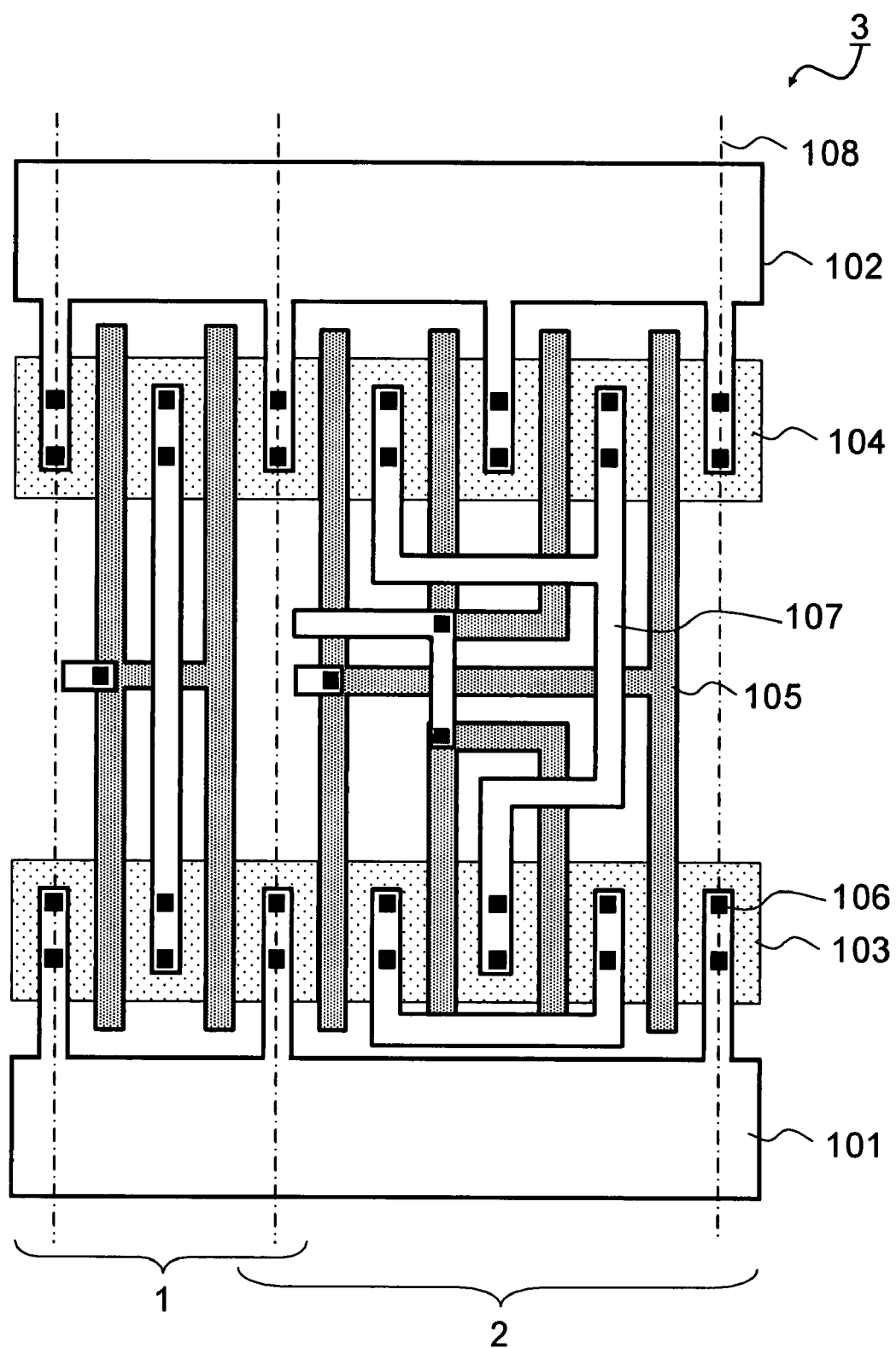
FIG. 5 is a plan view showing a circuit combining the standard cell of FIG. 1 and the standard cell of FIG. 3.

FIG. 5 is a plan view showing a circuit combining the standard cell 1 of FIG. 1 and the standard cell 2 of FIG. 3. In FIG. 5, components identical to those in FIG. 1 are denoted by reference numerals identical therein with detailed description omitted as appropriate.

The circuit 3 of FIG. 5 is formed by overlapping the right cell boundary 108 of the standard cell 1 in FIG. 1 with the left cell boundary 108 of the standard cell 2 in FIG. 3. Thus, the N-type diffusion layers 103 as well as the P-type diffusion layers 104 of neighboring standard cells are integrally formed by combining a plurality of standard cells. Thus, sufficient LOD is acquired and N-channel and P-channel MOSFETs with desired ON current are obtained. Here, only two standard cells are combined in FIG. 5. However, three or more standard cells can be combined in practice to acquire LOD that is large enough to obtain constant ON current.

As mentioned above, among the N-type diffusion layers 103 and the P-type diffusion layers 104, lines of the polysilicon layers 105 are formed in the up-to-down direction at even intervals, or the same pitch. Further, it is preferred that the gate length of each gate electrode composed of the polysilicon layer 105 is the same with each other. Thus, the variation of the gate length in the photolithography process can be reduced by forming gate electrodes with the same gate length at the same pitch.

Furthermore, over the P-type diffusion layers 104 as well as the N-type diffusion layers 103, two, or the same number of, contacts 106 arranged in the top-to-bottom direction are formed at even intervals in the left-to-right direction. Thus, the variation in ON current can further be reduced.

In addition, each line of contacts 106 is formed over the N-type diffusion layer 103 or the P-type diffusion layer 104, and in the center between the neighboring gate electrodes composed of the polysilicon layer 105. Thus, the variation in ON current can further be reduced.

Further, in the standard cells such as standard cell 1 and cell 2 of the first embodiment, the P-type diffusion layer 104 is connected to the power source wire 102 and the N-type diffusion layer 103 is connected to the grounding wire 101 at each cell boundary 108. Therefore, any standard cell can be combined to each other. In the conventional standard cells, there is a limit to layout since some standard cells cannot structurally be combined to each other.

Figure 6:
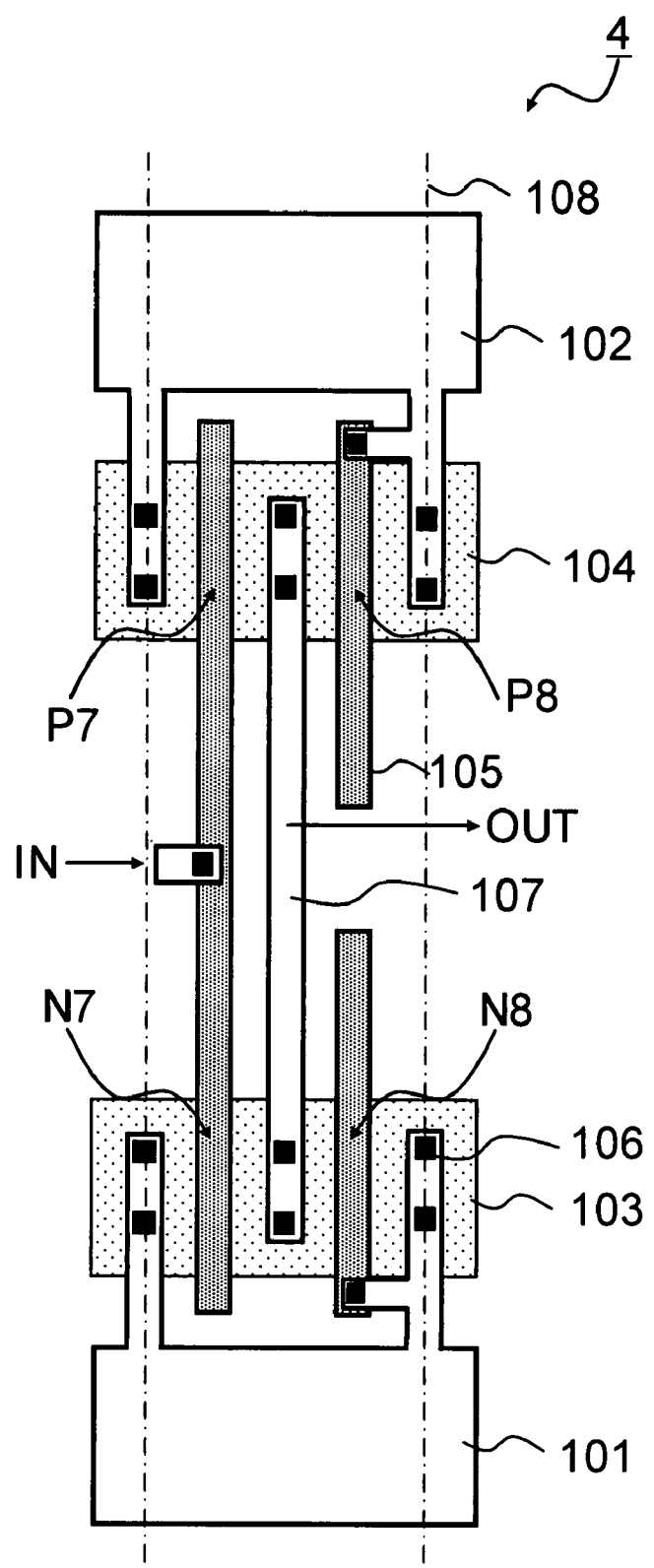
FIG. 6 is a plan view showing another standard cell for the semiconductor IC of the first embodiment of the present invention.
Figure 7:
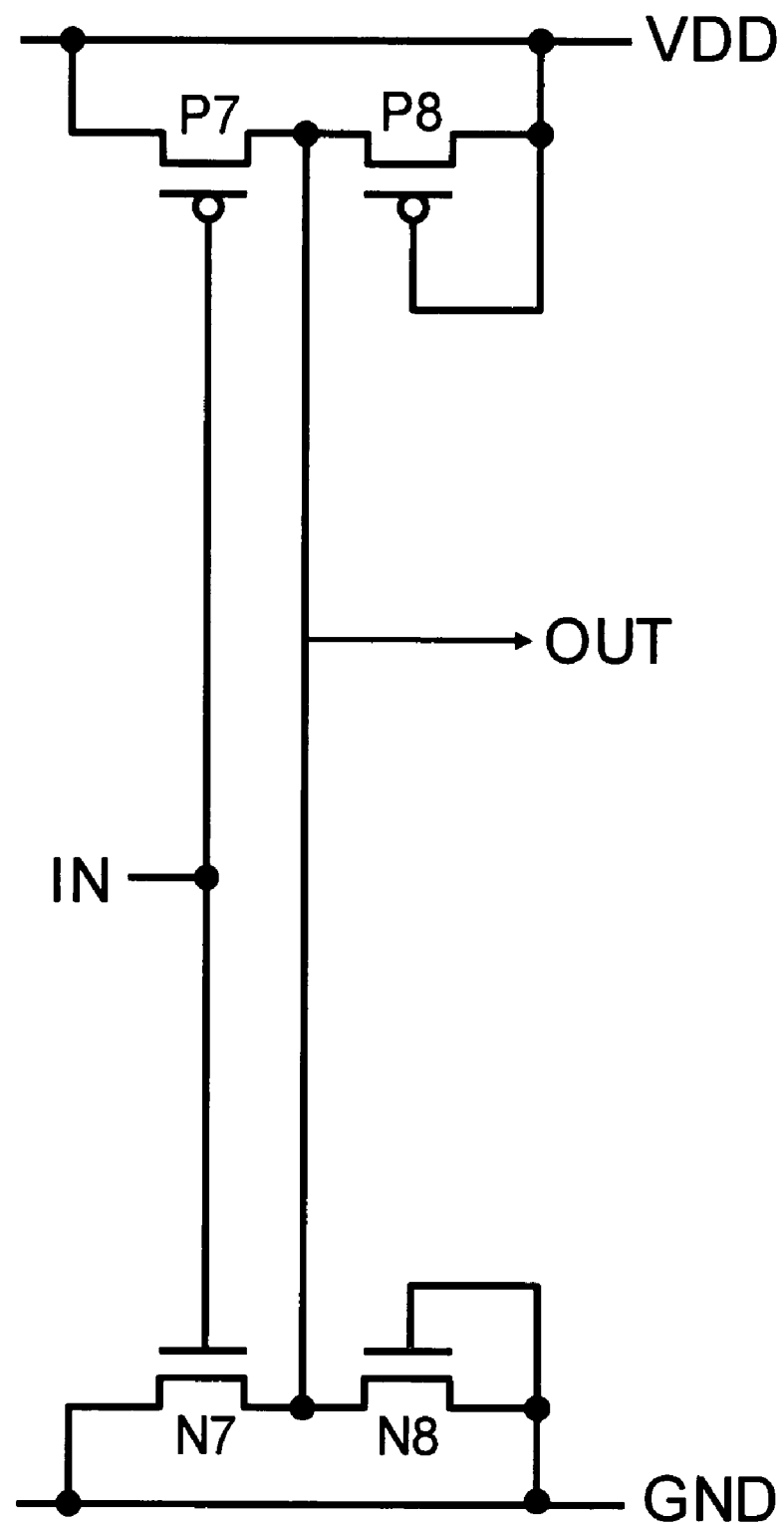
FIG. 7 is a circuit diagram corresponding to the standard cell of FIG. 6.

FIG. 6 is a plan view showing another standard cell 4 for the semiconductor IC of the first embodiment of the present invention. In FIG. 6, components identical to those in FIG. 1 are denoted by reference numerals identical therein with detailed description omitted as appropriate. FIG. 7 is a circuit diagram corresponding to the standard cell of FIG. 6.

The main difference between the standard cell 1 of FIG. 1 and the standard cell 4 of FIG. 6 is that one of two lines of the polysilicon layers 105 is separated into the side of the N-type diffusion layer 103 and the side of the P-type diffusion layer 104. Although the standard cell 4 has two P-channel MOSFETs (P7 and P8) and two N-channel MOSFETs (N7 and N8), the P-channel MOSFET P8 and N-channel MOSFET N8 are dummy MOSFETs. By using dummy MOSFETs, the P-type diffusion layer 104 can be connected to the power source wire 102 and the N-type diffusion layer 103 can be connected to the grounding wire 101 at each cell boundary 108.

Next, the circuit structure of the standard cell 4 of FIG. 6 is explained by using the circuit diagram of FIG. 7. An input terminal represented as "IN" in FIG. 7 is connected to the gate electrodes of the above two MOSFETs (P7 and N7). The source region of the P-channel MOSFET P7 is connected to the power source represented as "VDD" in FIG. 7. The drain region of the P-channel MOSFET P7 is connected to an output terminal represented as "OUT" in FIG. 7. On the other hand, the source region of the N-channel MOSFET N7 is connected to the ground represented as "GND" in FIG. 7. The drain region of the N-channel MOSFET N7 is connected to the output terminal. Further, each drain region of N1 and N2 is connected to each other in parallel. As mentioned above, the P-channel MOSFET P8 and N-channel MOSFET N8 are dummy MOSFETs. Specifically, the standard cell 4 which is composed of the P-channel MOSFET P7 and the N-channel MOSFET N7 connected to each other in series constitutes the simplest inverter circuit.

Figure 8:
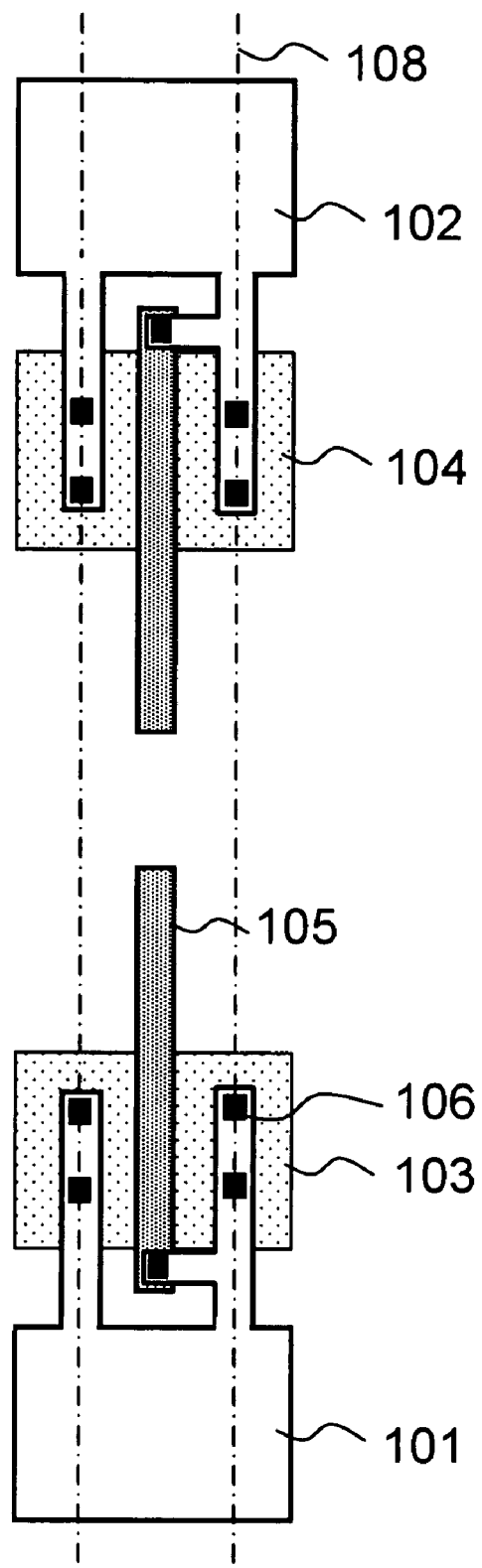
FIG. 8 is a plan view showing another standard cell for the semiconductor IC of the first embodiment of the present invention.

In addition, one or more standard cells composed of only two dummy MOSFETs shown in FIG. 8 may be positioned at one end or both ends of all of the arranged standard cells. Thus, the gate lengths of active MOSFETs can be constant. Although a plurality of standard cells are arranged to combine with each other, the gate length of the polysilicon layer 105 at the both ends of the combined cells is easy to fluctuate in the photolithography process. Here, a plurality of standard cells of FIG. 8 may be combined with each other to make one standard cell.

Figure 9:
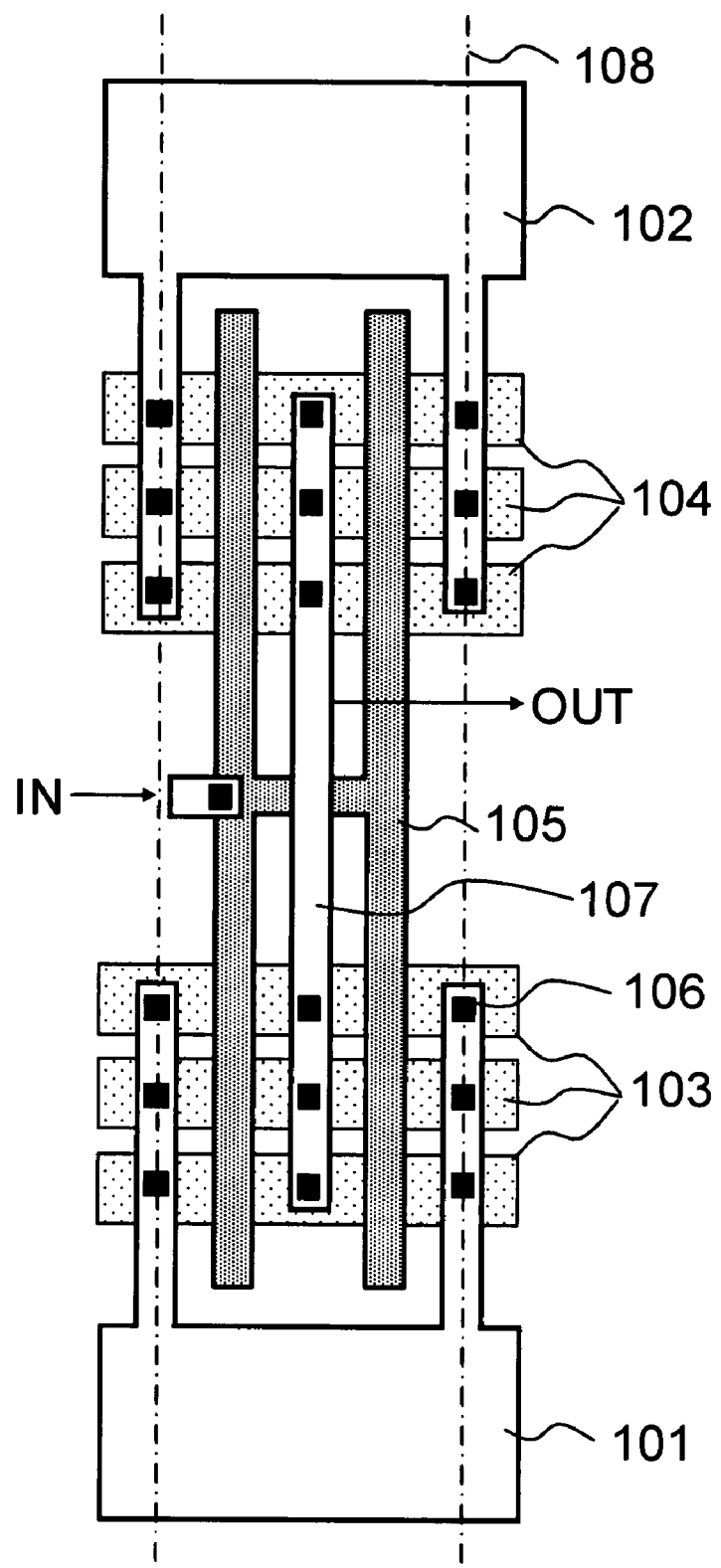
FIG. 9 is a plan view showing another standard cell for the semiconductor IC of the first embodiment of the present invention.

By the way, as shown in FIG. 9, the N-type diffusion layers 103 and the P-type diffusion layers 104 may be separately formed in the top-to-bottom direction respectively. Such a structure conforms with the recent trend to miniaturization of semiconductor ICs. Further, the variation of the circuit structure of the standard cell can be increased.

Figure 10:
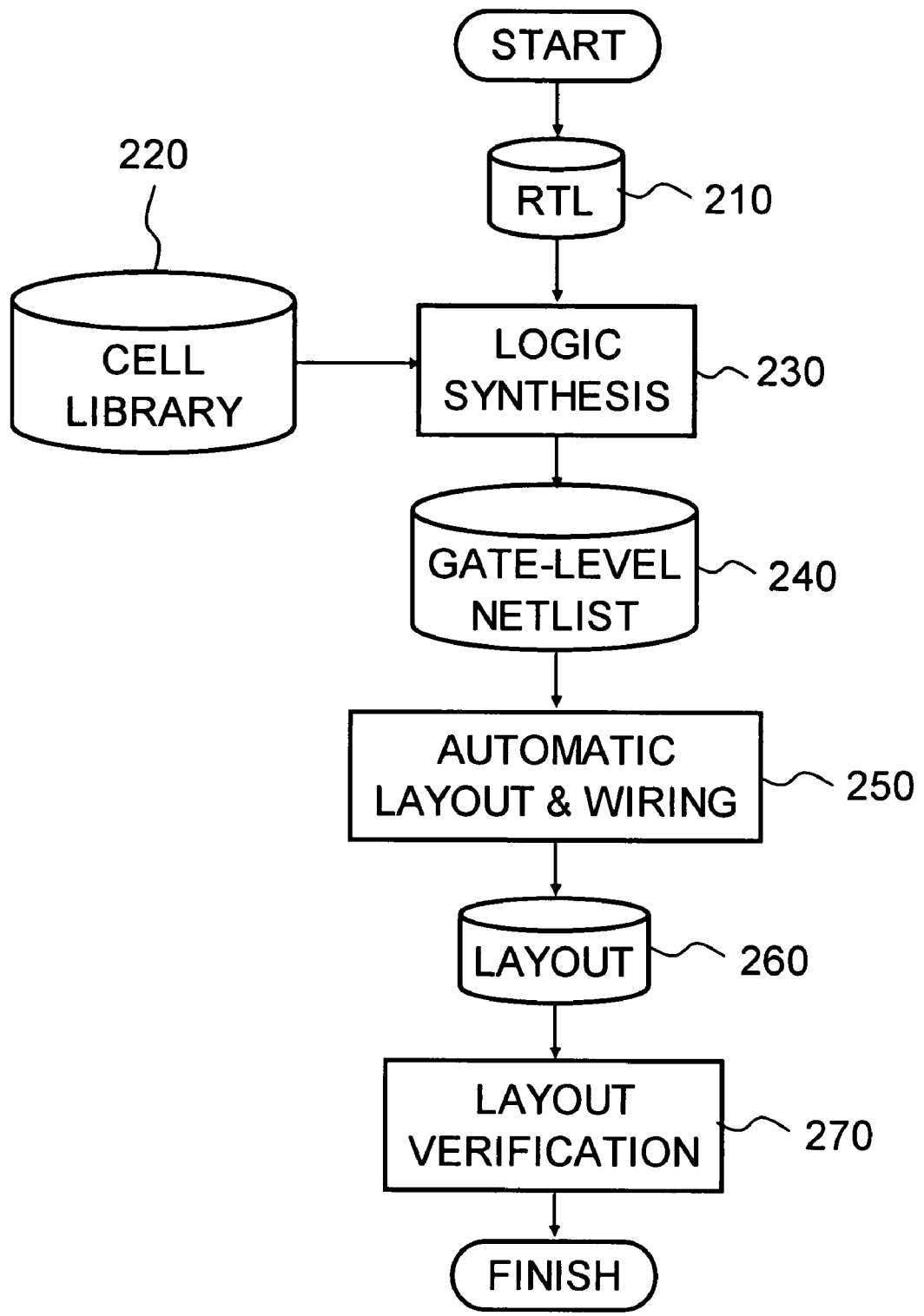
FIG. 10 is a flowchart illustrating a design process of the semiconductor IC of the first embodiment of the present invention.

Next, the design method for semiconductor ICs of the present invention is described with reference to FIG. 10. FIG. 10 is a flowchart illustrating a design process of the semiconductor IC of the first embodiment of the present invention. First, as shown in FIG. 10, based on a description of RTL (Register Transfer Level) 210, appropriate standard cells are chosen from the cell library 220 in which a plurality of standard cells are registered and logic synthesis 230 is done. Thus, a gate-level netlist 240 is produced.

In standard cells of the first embodiment, the connecting portion for connecting the N-type diffusion layer 103 to the grounding wire 101 and the connecting portion for connecting the P-type diffusion layer 104 to the power source wire 102 are formed at each cell boundary 108 of the both side. Therefore, the logic synthesis 230 is easily performed since any standard cell can be combined to each other. On the other hand, in Japanese Unexamined Patent Publication No. 2005-229061, for example, since circuits having the same logic and different drive capability must be formed from a limited number of standard cells, a special logic synthesis tool for changing drive capability is needed in logic synthesis 230. The commercial logic synthesis tool made by a tool vender is not easy to be modified. Further, developing the logic synthesis tool independently requires enormous time and cost. However, the special logic synthesis tool is not necessary by utilizing standard cells of the first embodiment. Therefore, logic synthesis 230 is easily done by utilizing any commercial logic synthesis tool.

Next, in the step of automatic layout and wiring 250, standard cells are arranged and wiring among arranged standard cells is decided based on data of gate-level netlist 240. Data of layout 260 of desired semiconductor IC are produced by the step of automatic layout and wiring 250.

Finally, layout verification 270 for verifying that the layout and the wiring are appropriate is done by comparing the data of layout 260 with the data of gate-level netlist 240.

Figure 11:
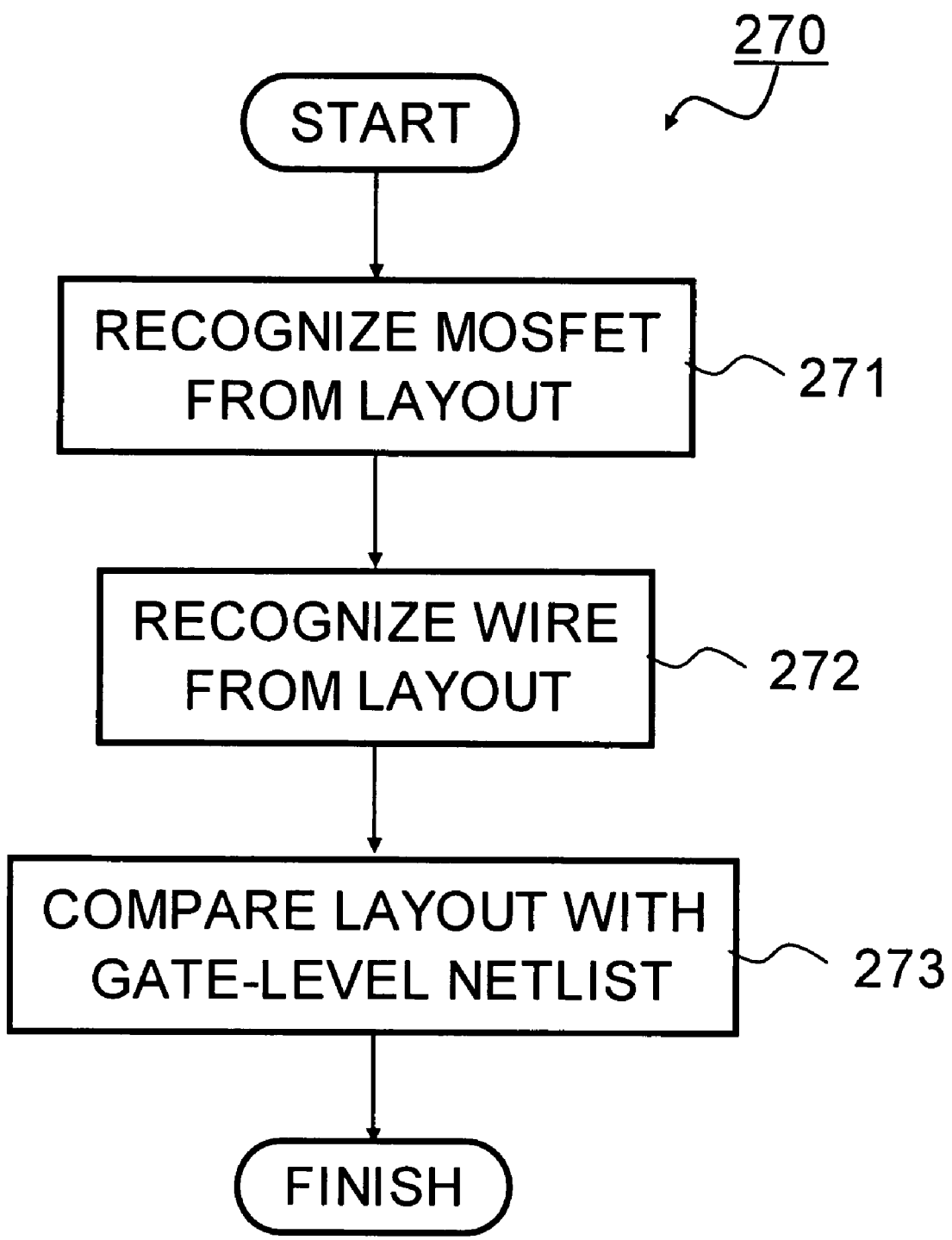
FIG. 11 is a flowchart illustrating steps of layout verification 270 of FIG. 10 in detail.

FIG. 11 is a flowchart illustrating steps of layout verification 270 of FIG. 10 in detail. Specifically, the layout verification 270 includes a step 271 for recognizing MOSFETs from the layout, a step 272 for recognizing wires from the layout, and a step 273 for comparing the data of layout 260 with the data of gate-level netlist 240 as shown in FIG. 11.

On the other hand, in Japanese Unexamined Patent Publication No. 9-289251, for example, a special tool for automatic layout and wiring 250 is required to insert dummy MOSFETs between each standard cell. Further, a step for recognizing dummy MOSFETs from the layout is required between the step 271 for recognizing MOSFETs from the layout and the step 272 for recognizing wires from the layout in layout verification 270. Thus, a special tool for layout verification 270 is needed. However, by utilizing standard cells of the first embodiment, the special tool for automatic layout and wiring 250 or layout verification 270 is not necessary. Therefore, automatic layout and wiring 250 and layout verification 270 are easily done by utilizing any commercial tool.

Second Embodiment

Figure 12:
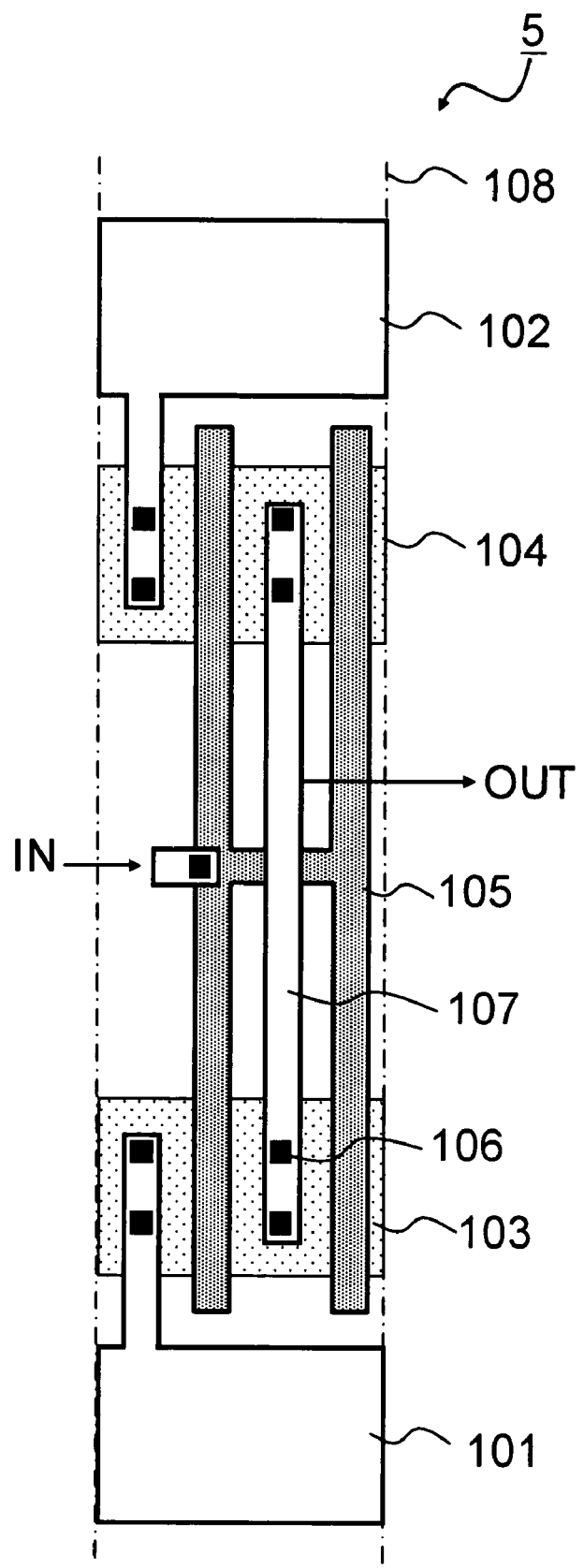
FIG. 12 is a plan view showing a standard cell for the semiconductor IC of the second embodiment of the present invention.

Next, a second embodiment of the present invention is described. FIG. 12 is a plan view showing a standard cell 5 for the semiconductor IC of the second embodiment of the present invention. In FIG. 12, components identical to those in FIG. 1 are denoted by reference numerals identical therein with detailed description omitted as appropriate.

The standard cell 5 of FIG. 12 has the same circuit structure shown in FIG. 2 with the standard cell 1 of FIG. 1. In the first embodiment, the P-type diffusion layer 104 is connected to the power source wire 102 and the N-type diffusion layer 103 is connected to the grounding wire 101 at each cell boundary 108. The standard cell of the second embodiment has a connecting portion for connecting the N-type diffusion layer 103 to the grounding wire 101 and a connecting portion for connecting the P-type diffusion layer 104 to the power source wire 102 at only one fixed cell boundary 108. No connecting portion is formed at the opposite cell boundary 108.

Specifically, compared with the standard cell 1 of FIG. 1, a connecting portion for connecting the N-type diffusion layer 103 to the grounding wire 101 and a connecting portion for connecting the P-type diffusion layer 104 to the power source wire 102 are not formed at the right side in the standard cell 5 of FIG. 12. Therefore, more memory capacity in the cell library can be saved than in the first embodiment. As a matter of course, standard cell 5 alone cannot constitute the circuit of FIG. 2. However, the standard cell 5 combined with another standard cell of the second embodiment in the right side can constitute the circuit of FIG. 2.

Figure 13:
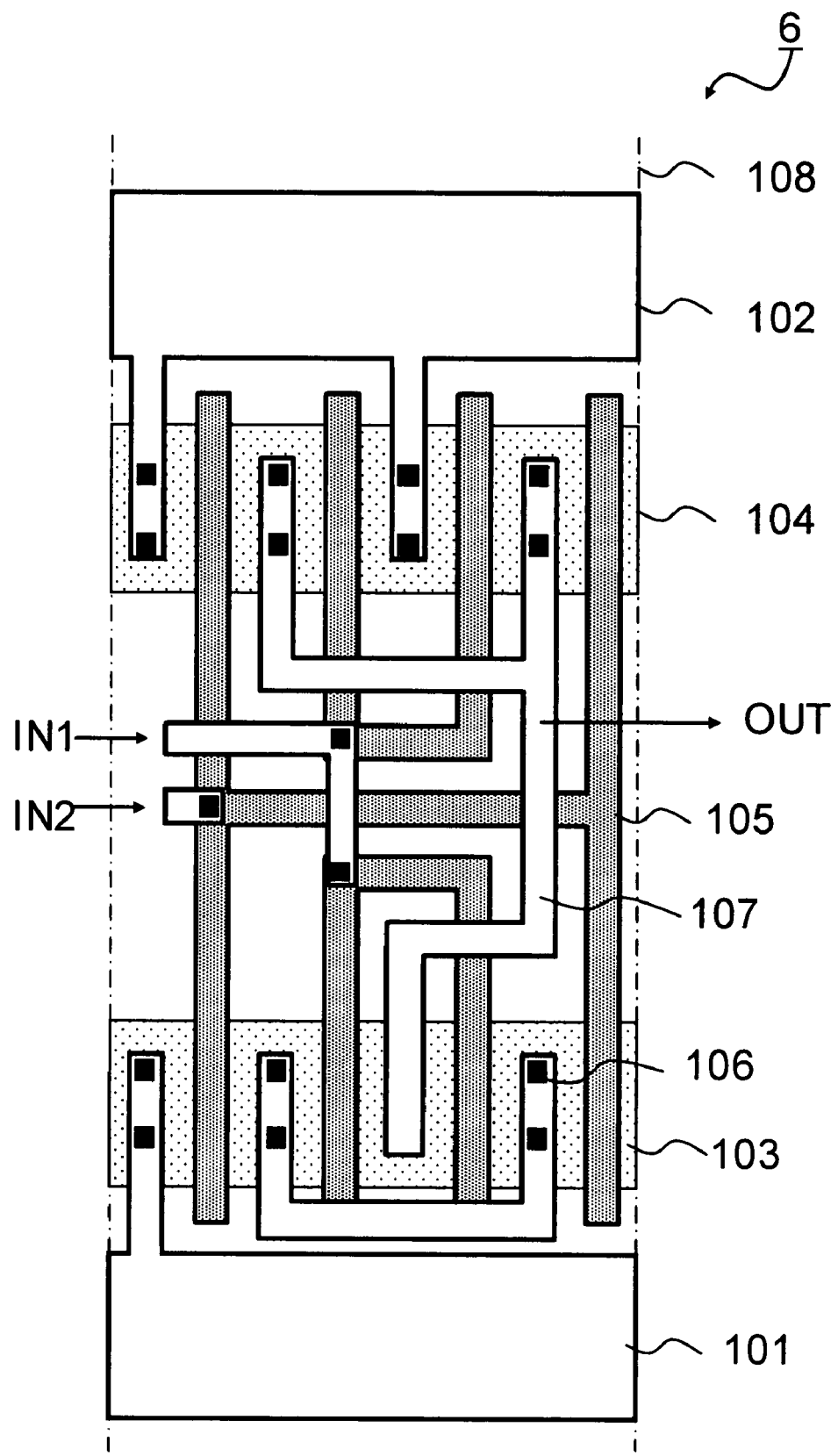
FIG. 13 is a plan view showing another standard cell for the semiconductor IC of the second embodiment of the present invention.

FIG. 13 is a plan view showing another standard cell 6 for the semiconductor IC of the second embodiment of the present invention. In FIG. 13, components identical to those in FIG. 1 are denoted by reference numerals identical therein with detailed description omitted as appropriate.

The standard cell 6 of FIG. 13 has the same circuit structure shown in FIG. 4 of the standard cell 2. Compared with the standard cell 2 of FIG. 3, a connecting portion for connecting the N-type diffusion layer 103 to the grounding wire 101 and a connecting portion for connecting the P-type diffusion layer 104 to the power source wire 102 are not formed at the right side in the standard cell 6 of FIG. 13 just as the standard cell 5 of FIG. 12. Therefore, more memory capacity in the cell library can be saved than in the first embodiment.

Figure 14:
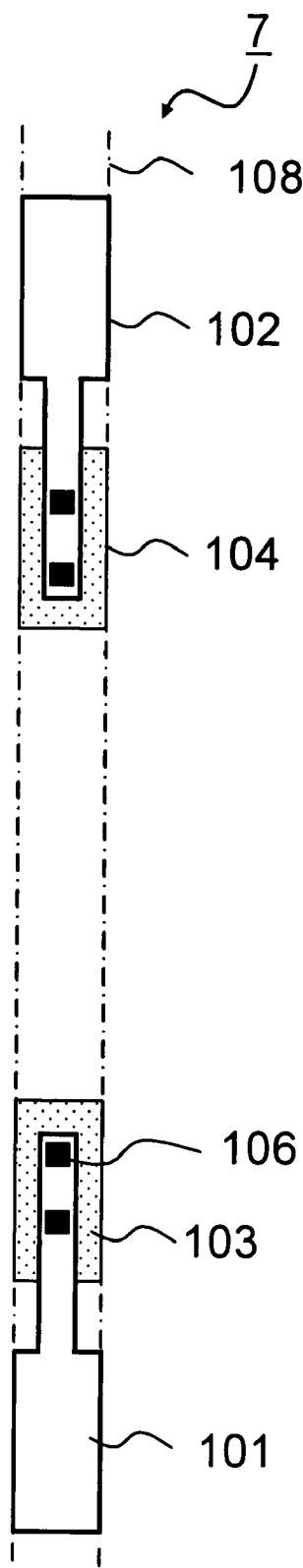
FIG. 14 is a plan view showing another standard cell for the semiconductor IC of the second embodiment of the present invention.

FIG. 14 is a plan view showing another standard cell 7 for the semiconductor IC of the second embodiment of the present invention. In FIG. 14, components identical to those in FIG. 1 are denoted by reference numerals identical therein with detailed description omitted as appropriate.

The standard cell 7 of FIG. 14 is composed only of a connecting portion for connecting the N-type diffusion layer 103 to the grounding wire 101 and a connecting portion for connecting the P-type diffusion layer 104 to the power source wire 102 at the cell boundary 108 of the first embodiment. This standard cell 7 is arranged at the very end, when combining a plurality of standard cells such as the standard cell 6, the standard cell 7 or the like.

Figure 15:
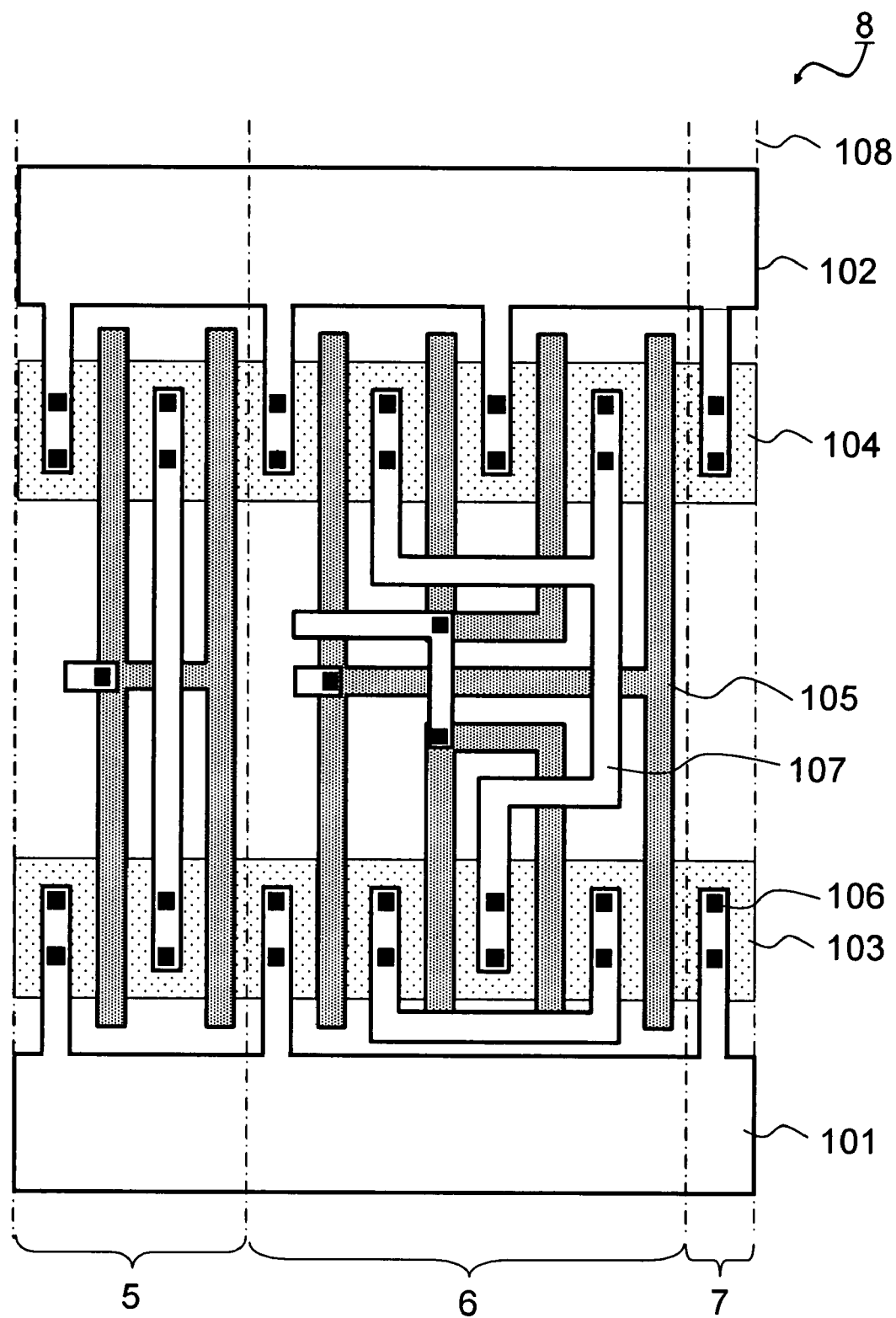
FIG. 15 is a plan view showing a circuit combining the standard cells of FIGS. 12 to 14.

A circuit 8 shown in FIG. 15 is formed by combining the standard cell 5 of FIG. 12, the standard cell 6 of FIG. 13, and the standard cell 7 of FIG. 14. The circuit 8 is identical with the circuit 3 of FIG. 5.

It is apparent that the present invention is not limited to the above embodiment but may be modified and changed without departing from the scope and spirit of the invention.

What is claimed is:

1. A semiconductor integrated circuit comprising:
   a plurality of standard cells arranged in a first direction on a semiconductor substrate, each cell being separated from neighboring standard cells by a cell boundary between the neighboring standard cells; and
   a first diffusion layer connected to a first power source and a second diffusion layer connected to a second power source in each of the plurality of standard cells,
   wherein the first diffusion layer as well as the second diffusion layer of all of the plurality of standard cells are integrally formed;
   wherein no isolation region is formed between neighboring standard cells at the cell boundary,
   wherein a dummy MOSFET is positioned at one end of all of the arranged standard cells beyond the cell boundaries.

2. The semiconductor integrated circuit according to claim 1, wherein each width of the first diffusion layer and the second diffusion layer is constant throughout all of the arranged standard cells.

3. The semiconductor integrated circuit according to claim 1, wherein a plurality of gate electrodes are formed at even intervals in the first direction throughout all of the arranged standard cells.

4. The semiconductor integrated circuit according to claim 3, wherein the plurality of gate electrodes have the same gate length.

5. The semiconductor integrated circuit according to claim 1, wherein each of the plurality of standard cells has a first connecting portion to connect the first diffusion layer to the first power source and a second connecting portion to connect the second diffusion layer to the second power source, the first connecting portion and the second connecting portion both being shared by the neighboring standard cells at each cell boundary.

6. The semiconductor integrated circuit according to claim 1, wherein the first diffusion layer and/or the second diffusion layer are separately arranged in a second direction crossing the first direction.

7. The semiconductor integrated circuit according to claim 1, wherein dummy MOSFETs are positioned at both ends of all of the arranged standard cells beyond the cell boundaries.

8. The semiconductor integrated circuit according to claim 1, wherein each of the first diffusion layer and the second diffusion layer include at least one MOSFET which functions as a circuit element in each of the plurality of standard cells.

* * * * *